March 21, 1961 J. McLAUCHLIN WINSTON 2,976,384

SWITCH

Filed Nov. 6, 1958

INVENTOR.

JOHN McLAUCHLIN WINSTON

BY

Mason, Kolehmainen, Rathburn & Wyss

Attys.

2,976,384

SWITCH

John McLauchlin Winston, Washington, Ind., assignor to Sarkes Tarzian, Inc., Bloomington, Ind., a corporation of Indiana Filed Nov. 6, 1958, Ser. No. 772,370

3 Claims. (Cl. 200—166)

The present invention relates to switches such, for example, as those used in the tuners of television receivers and it more particularly relates to a new and improvement arrangement for securing contact clips to the stator wafer of a rotary selector switch in such a manner that the clips do not become loose when solder connections are made thereto.

Television tuners of the switch type generally comprise a plurality of multiple contact rotary switches which are respectively used in selectively tuning the various tuned circuit stages of the tuners for the selective reception of the signals transmitted in each of the television channels. Each of the switches which are thus used in this type of tuner generally comprises a rigid stator wafer formed of a suitable insulating material such as bakelite or a paper or cloth base phenolic laminate to which a plurality of contact clips are riveted. The verb "riveting" is used herein to denote the connection of components by either rivets or eyelets. The contact clips, which are thus mounted on the stator, are adapted to be selectively engaged by the wiper portion of a rotor which is journaled in a central aperture within the stator, and therefore, the switch may be used to selectively connect various tuned circuit components such, for example, as incremental inductances, into the tuned circuits whose frequencies are being controlled.

A common problem which has existed with this type of switch is that when the circuit components of the tuner are soldered to the contact clips, the heat which is transferred by the clips to the stator causes the adjacent portions of the stator wafer to melt or otherwise decompose so that following the soldering operation when the clips cool, they are no longer tightly affixed to the stator but are somewhat loose. While the relative motion thus provided between the clips and the stator is very slight, it is extremely detrimental to the accurate switching of critical tuning circuits, and should be avoided. Many attempts, for the most part featuring mechanical interference, have been made to correct this problem but they have thus far been unsuccessful.

Therefore, an object of the present invention is to provide a new and improved arrangement for securing metallic contact clips to a stator wafer.

Another object of the present invention is to provide a new and improved selector switch which is suitable for use in television tuners where accurate switching is essential.

A further object of the present invention is to provide a new and improved arrangement for securing a contact clip to a support member.

Another object of the present invention is to provide a new and improved arrangement for preventing the connection between contact clips and an insulating support from becoming loose when solder connections are made to the clips.

Briefly, the above and further objects are realized in accordance with the present invention by interposing a thermoplastic adhesive between the contact clips and the support member on which they are mounted so that when the clips are heated during a succeeding soldering operation, any of the support material which decomposes in the vicinity of the clip is replaced by the adhesive which becomes plastic at the soldering temperatures. Moreover, since the clip is compressed against the stator while the adhesive is hard, during the soldering operation the clip moves a short distance toward the stator thereby to become somewhat embedded in the adhesive. Therefore, when the clip and stator wafer cool down following the soldering operation, the adhesive material solidifies and thereby anchors the clip to the support so that no looseness of the connection results.

The invention, both as to its organization and method of operation, together with further objects and advantages thereof, will best be understood by reference to the following description taken in connection with the accompanying drawings, in which.

Figures 1, 2, 3, 4, 5:
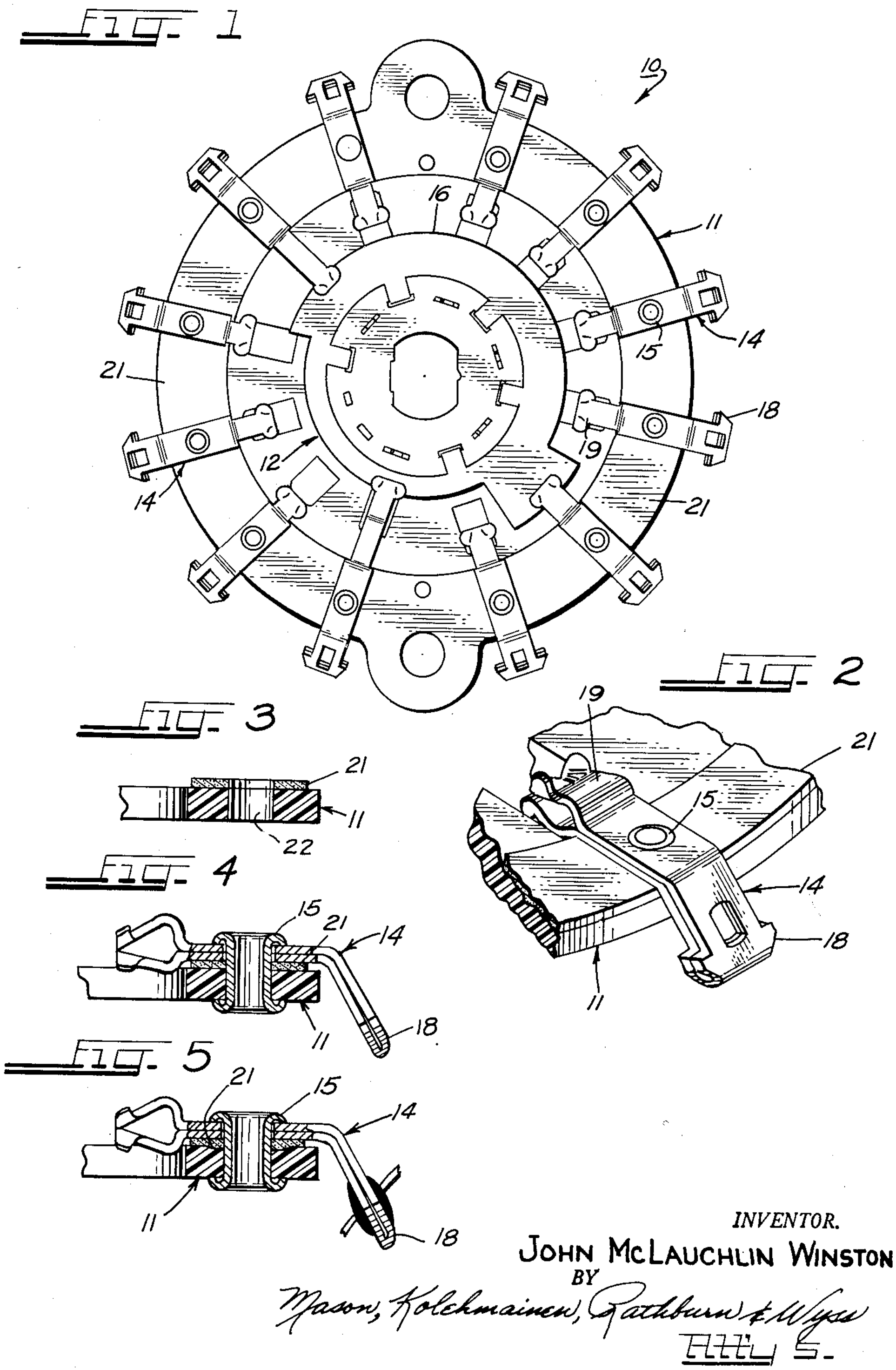
Fig. 1 is a plan view of a multiple contact rotary switch embodying the present invention.
Fig. 2 is a greatly enlarged fragmentary perspective view showing the connection of a contact clip to the stator in the switch of Fig. 1.

Figs. 3, 4, and 5 are greatly enlarged, fragmentary cross sectional views showing the steps involved in making a connection between a contact clip and the stator in the switch of Fig. 1.

Referring now to the drawings and particularly to Fig. 1 thereof, there is shown a switch 10 comprising an annular stator wafer 11 in the central aperture of which a rotor 12 is journaled. The stator 11 is formed of a suitable insulating material such as a paper or cloth base phenolic laminate or bakelite, and a plurality of conductive contact clips 14 are secured to one face thereof by respective ones of a plurality of eyelets 15. The contact clips 14 are spatially arranged about the periphery of the stator 11 and an irregularly shaped contact wiper 16 is mounted on the rotor 12 for selectively engging the clips 14. The clips 14 each include an apertured terminal portion 18 to which solder connections may be made and a set of fixed contact portions 19 which are resiliently pressed together and engage opposite sides of the wiper 16. In order to prevent the connections between the clip 14 and the stator 11 from loosening when the clips 14 are heated during the soldering operation, a coating 21 of a thermoplastic adhesive is provided on the upper face of the stator 11 so that, as best shown in Fig. 2, the adhesive 21 is interposed between the clip 14 and the wafer 11.

Referring to Fig. 3, there is shown a portion of the stator wafer 11 prior to the connection thereto of the contact clip. As there shown, the adhesive coating 21 is provided on the upper surface of the peripheral portion of the wafer. The adhesive 21 has the characteristic that at room temperatures and at the normal operating temperatures of the switch 10 it is very hard, while at the temperatures normally encountered during a soldering operation it is plastic. A plurality of apertures 22, which accommodate the eyelets 15 which secure the clips 14 to the wafer 11, extend through the wafer 11 and the adjacent portion of the coating 21. In assembling the switch 10, the clips 14 are riveted by means of the eyelets 15 to the stator 11 in the conventional manner with the adhesive coating 21 sandwiched between the clips 14 and the wafer 11. In order to facilitate an understanding of the invention, the adhesive coating 21 is shown as being substantially thicker than it actually is; in a switch constructed in accordance with the present invention, a coating thickness of about .002 inch on a wafer of .063 inch thickness performed satisfactorily.

As shown in Fig. 5, when a solder connection is made to the terminal portion 18 of the clip 14, the heat which is transferred to the wafer 11 by means of the eyelet 15 causes the adjacent portion of the wafer 11, particularly at the upper surface thereof which is closest to the point at which the heat is applied to the eyelet 15, to decompose or otherwise be removed from the area beneath the clip 14 adjacent to the eyelet 15. In the absence of the adhesive material 21, this void would cause a loosening of the connection between the clip 14 and the stator 11 which would adversely affect the accurate switching of the tuning circuits associated with the switch 10. However, since the adhesive 21, which may be a synthetic resin, such as Bostik 7026 cement manufactured and sold by the BB Chemical Company of Cambridge, Massachusetts, becomes plastic at the normal soldering temperature, it cements the clip 14 to the stator 11 when the unit is cooled. Moreover, the softening of the adhesive 21 permits the clip 14, which is held in compression against the wafer 11 by the eyelet 15, to move a slight distance toward the face of the wafer 11 so that it becomes partially embedded in the adhesive 21. Therefore, when the clip cools at the completion of the soldering operation and the adhesive 21 again sets up and becomes hard, it firmly anchors the clip 14 to the stator wafer 11. Consequently, a tight connection between the clip 14 and the stator wafer 11 is assured.

The present invention thus provides a switch construction in which the contact clips remain tightly and unmovably connected to a support wafer on which they are mounted even after a soldering operation during which the temperatures of the clips are elevated to values exceeding the decomposition point of the stator material.

While there has been described what is at present considered to be the preferred embodiment of the invention, it will be understood that various modifications may be made therein which are within the true spirit and scope of the invention as defined in the appended claims.

What is claimed as new and is desired to be secured by Letters Patent of the United States is:

1. A multiple contact rotary switch, comprising an annular stator wafer formed of a thermosetting resin, a rotor journaled in the aperture of said stator, a plurality of metallic contact clips riveted to one face of said stator for selective engagement by said rotor, and a layer of a thermoplastic adhesive provided on said face between said stator and said clips, said adhesive being hard at the normal operating temperature of said switch and becoming plastic at temperatures used in making solder connections to said clips, whereby the application of heat to said clips while making solder connections thereto causes said adhesive to become tacky, whereupon cooling of said clips permits said adhesive to set and firmly anchor said clips to said stator.

2. A multiple contact rotary switch, comprising an annular stator formed of a thermosetting resin, a rotor journaled in the aperture of said stator, a plurality of contact clips riveted to said stator for selective engagement by said rotor, and a thermoplastic adhesive coating provided on a portion of said stator, said coating being interposed between said stator and said clips, whereby the application of heat to said clips while making solder connections thereto causes said adhesive to become tacky, whereupon cooling of said clips permits said adhesive to set and firmly anchor said clips to said stator.

3. In combination, a thermosetting support, a coating of a thermoplastic material on at least a portion of said support, a metallic contact clip mounted on said support over said coating, and rivet means pressing said clip against said support to secure said clip to said support.

References Cited in the file of this patent

UNITED STATES PATENTS

| | | |
|---|---|---|
| 2,594,190 | Mastney | Apr. 22, 1952 |
| 2,828,393 | Wingard | Mar. 25, 1958 |